United States Patent
Nido et al.

[11] Patent Number: 5,902,393
[45] Date of Patent: May 11, 1999

[54] METHOD FOR GROWING P-TYPE GALLIUM NITRIDE BASED COMPOUND SEMICONDUCTORS BY VAPOR PHASE EPITAXY

[75] Inventors: Masaaki Nido; Akira Usui; Yasunori Mochizuki, all of Tokyo, Japan

[73] Assignee: NEC Corporation, Tokyo, Japan

[21] Appl. No.: 08/785,654

[22] Filed: Jan. 17, 1997

[30] Foreign Application Priority Data

Jan. 19, 1996 [JP] Japan .................................. 8-007298

[51] Int. Cl.⁶ ........................................................ C30B 1/02
[52] U.S. Cl. ...................... 117/2; 117/3; 117/89; 117/93; 117/105; 117/952
[58] Field of Search .................... 117/2, 3, 952, 117/89, 93, 105

[56] References Cited

U.S. PATENT DOCUMENTS

| | | | |
|---|---|---|---|
| 4,473,938 | 10/1984 | Kobayashi et al. | 117/952 |
| 5,210,051 | 5/1993 | Carter, Jr. | 117/952 |
| 5,389,571 | 2/1995 | Takeuchi et al. | 117/952 |
| 5,433,169 | 7/1995 | Nakamura | 117/952 |
| 5,563,422 | 10/1996 | Nakamura | 257/13 |
| 5,637,531 | 6/1997 | Porowski et al. | 117/952 |

FOREIGN PATENT DOCUMENTS

| | | | |
|---|---|---|---|
| 3-218625 | 9/1991 | Japan | H01L 21/263 |
| 5-183189 | 7/1993 | Japan | H01L 33/00 |
| 6-232451 | 8/1994 | Japan | H01L 33/00 |

OTHER PUBLICATIONS

"Candela–class high–brightness InGaN/AlGaN double–heterostructure blue–light–emitting diodes" Nakamura et al 1994 American Institute of Physics; Appl. Phys. Lett. 64 (13); Mar. 28, 1994: pp. 1687–1689.

"Highly P–Typed Mg–Doped GaN Films Grown with GaN Buffer Layers" Nakamura et al Japanese Journal of Applied Physics; vol. 30, No. 10A; Oct. 1991; pp. L 1708–L 1711.

*Primary Examiner*—Robert Kunemund
*Attorney, Agent, or Firm*—Haves Soloway Hennessey Grossman & Hage PC

[57] ABSTRACT

Disclosed is a method of growing 4 gallium nitride-based crystal by vapor phase epitaxy, suitable for mass production, without the necessity of thermal processing after completion of the crystal growth. The temperature of the substrate crystal immediately after completion of the crystal growth is 700° C. or higher, and cooling of the substrate crystal at 700° C. or lower after completion of the crystal growth is performed in an atmosphere of a hydrogen-fee carrier gas.

13 Claims, 4 Drawing Sheets

GROWTH OF P-TYPE GALLIUM NITRIDE
TRIMETHYL GALLIUM
AMMONIA
CYCLOPENTA-DIETHYL MAGNESIUM
HYDROGEN

FIG. 7

METHOD FOR GROWING P-TYPE GALLIUM NITRIDE BASED COMPOUND SEMICONDUCTORS BY VAPOR PHASE EPITAXY

BACKGROUND OF THE INVENTION

1. Field of the Invention

The present invention relates to a method for growing a semiconductor by vapor phase epitaxy, and more particularly to a method for growing a low-resistance p-type gallium nitride (GaN)-related compound semiconductor film by vapor phase epitaxy.

2. Description of the Related Art

Conventional methods for preparing a p-type gallium nitride-based compound semiconductor by vapor phase epitaxy involve use of a magnesium organo-metallic compound as a p-type dopant source material. Magnesium is known to have the lowest acceptor level of presently know p-type impurities for GaN related compound semiconductors.

However, it is known that the crystal immediately after growth has increased resistance due to the so-called "hydrogen passivation" phenomenon. That is, magnesium is electrically inactivated through its combination with hydrogen which is contained in the gases used for vapor phase epitaxy.

Figure 6:
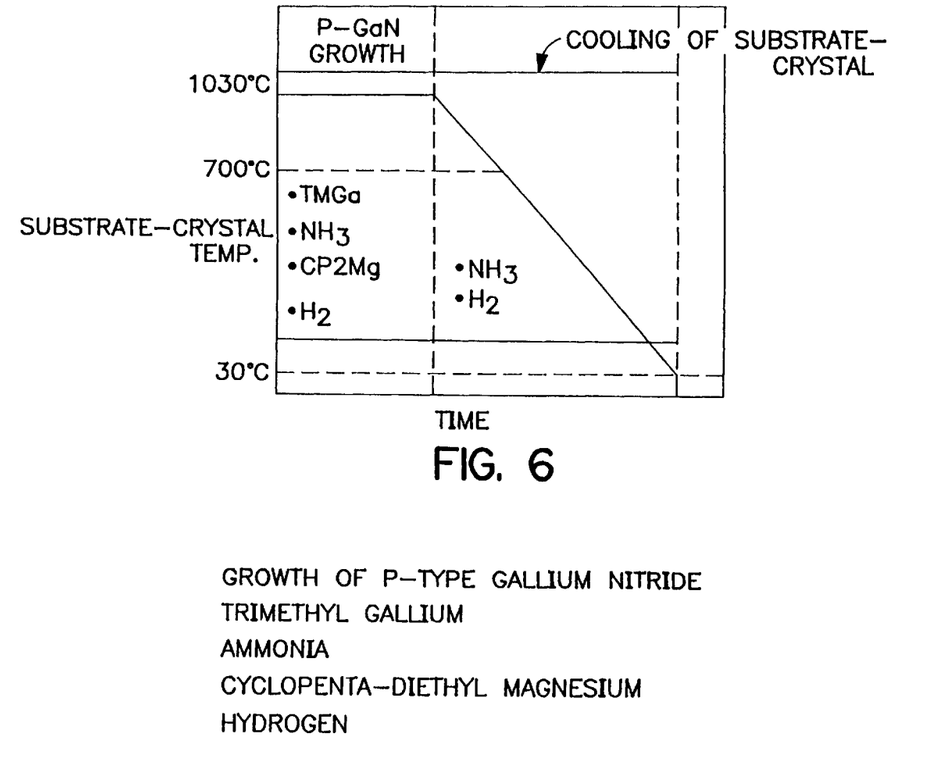
FIG. 6 is a schematic diagram illustrative of a variation of substrate temperature during the process of vapor phase epitaxy according to a conventional process of crystal growth of p-type gallium nitride by vapor phase epitaxy, and types of the gases introduced in such a crystal growwth chamber.

FIG. 6 is a schematic diagram illustrative of a substrate temperature variation during a process sequence of a conventional growth of a p-type gallium nitride crystal. Types of gases introduced into the crystal growth chamber (reaction chamber) is also shown in the figure (c.f. S. Nakamura, et al., *Japanese Journal of Applied Physics*, vol. 30, No. 10A, pp. L1708–L1711, 1991, for example). As shown in FIG. 6, the crystal grown temperature is 1030° C. The substrate is sapphire, the carrier gas used during the growth process is hydrogen, the gallium source material is trimethyl gallium (TMG), the nitrogen source material is ammonia, and the p-type dopant source material is cyclopenta-diethyl magnesium (CP2Mg).

After the crystal has been grown, the cooling of the substrate is performed in an atmosphere of hydrogen carrier gas and ammonia. In the process sequence of FIG. 6, hydrogen is not introduced into the crystal while the crystal is growing at high temperatures. However, hydrogen is diffused into the crystal from the surface during the process of cooling the substrate crystal after the growth has been completed and is combined with magnesium thus passivating magnesium with hydrogen. The source of hydrogen while the substrate crystal is cooled includes hydrogen which is directly bonded with nitrogen of the ammonia molecule and hydrogen of the hydrogen carrier gas.

Figure 7:
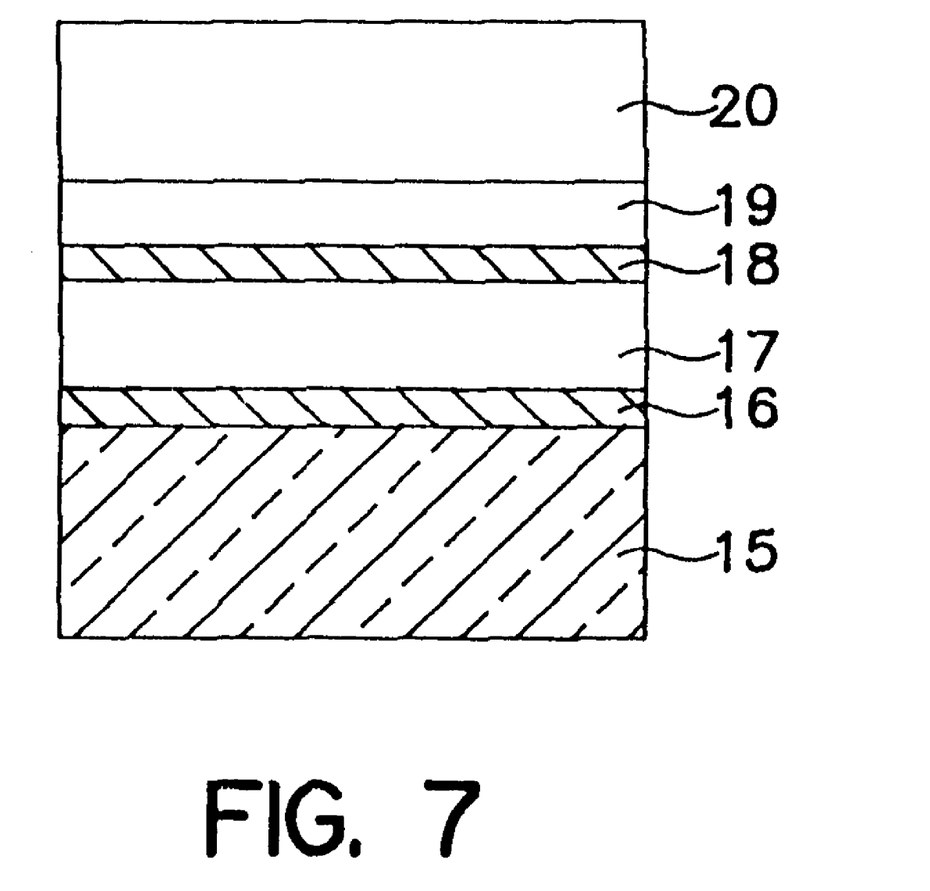
FIG. 7 is a schematic view illustrative of the layer structure of a LED crystal which is prepared by a conventional process of crystal growth by vapor phase epitaxy.

FIG. 7 illustrates the layer structure of an LED (light-emitting diode) crystal which is prepared by the method of growing a p-type gallium nitride by vapor phase epitaxy as illustrated in FIG. 6 (c.f. S. Nakamura et. al., *Applied Physics Letter* 64, No. 13, pp. 1687–1689, 1994).

The LED crystal consists of a Gab buffer layer 16, an Si-doped n-type GaN layer 17, an InGaN active layer 18, an Mg-doped p-type AlGaN layer 19 and an Mg-doped p-type GaN layer 20 on a sapphire substrate 15. Methods which have been suggested for decreasing the resistance of a high-resistance p-type gallium nitride-based compound semiconductor which has undergone hydrogen passivation as a result of vapor phase epitaxy include irradiation with low-energy electron beams (see Japanese Unexamined Patent Application Disclosure HEI 3-218625), and thermal annealing in a vapor phase atmosphere free of hydrogen atoms at a temperature 400° C. or higher, preferably approximately 700° C. (Japanese Unexamined Patent Application Disclosure HEI 5-183189).

Furthermore, several methods without the necessity of special treatment after the crystal is grown have been suggested for providing a low-resistance p-type GaN based compound semiconductor film by vapor phase epitaxy, These include growth of magnesium-doped gallium nitride on an $In_xAl_yGa_{1-x-y}N$ (0<x<1, 0≦y<1) layer (see Japanese Unexamined Patent Application Disclosure HEI 6-232451). This method is aimed at providing a low-resistance p-type layer by using an indium-containing gallium nitride-based compound semiconductor which is relatively soft, thus suppressing defect formation in gallium nitride films which, grow thereon. However, the attainable layer structure is limited and the effect of the resistance decrease is smaller than thermal annealing.

Another known method for obtaining low-resistance p-type gallium nitride is by molecular beam epitaxy in which the growth is accomplished using hydrogen-free source materials only. Here, metal gallium is used as the gallium source material, and nitrogen plasma is used as the nitrogen source material. However, the crystals presently gained by molecular beam epitaxy are, inferior to ones provided by vapor phase epitaxy which is more suitable for mass production.

Regarding treatments after vapor phase epitaxy aimed at lowering the resistance of p-type gallium nitride, irradiation by electron beams has the problem of low productivity, since only layers of thickness matching the penetration depth of the electron beams (on the order of 0.5 $\mu$m) have lower resistance.

The other method, thermal annealing, though capable of lowering the resistance of layers having thicknesses as large as several $\mu$m, and thus having increased productivity, causes desorption of nitrogen from the gallium nitride, inevitably leading to thermal deterioration of the crystal. The thermal deterioration of the crystal becomes more severe as the annealing is performed at a higher temperature.

SUMMARY OF THE INVENTION

Therefore, it is an object of the present invention to provide a method of growing a p-type gallium nitride-based compound semiconductor of high crystalline quality and low resistance by vapor phase epitaxy, which is suitable for mass production, without necessitating additional treatment such as thermal annealing or electron beam irradiation.

According to the present invention, there is provided a method of growing a low-resistance p-type gallium nitride-based compound semiconductor by a vapor phase epitaxy that comprises a step of introducing on a heated crystal substrate, a gas mixture of a group III element compound source gas, a nitrogen compound source gas, and a p-type dopant gas all diluted in a carrier gas such as hydrogen or nitrogen to form a p-type gallium nitride-based compound semiconductor, wherein the temperature of the substrate crystal immediately after completion of the crystal growth is 700° C. or higher, and after completion of the crystal growth cooling the substrate crystal to temperatures 700° C. or lower is performed in a hydrogen-free gas atmosphere.

The present invention also provides a method of growing a low-resistance p-type gallium nitride-based compound semiconductor as described above, characterized in that the cooling of the substrate crystal to 700° C. or lower after completion of the crystal growth is carried out in an atmosphere of a mixed gas of a hydrogen-free carrier gas and a gas of an organic nitrogen compound which has less than three direct bonds of nitrogen and hydrogen.

The present invention also provides a method of growing a low-resistance p-type gallium nitride-based compound semiconductor as described above, characterized in that after a requisite multilayer film which contains a p-type gallium nitride-based compound semiconductor layer has been formed, an n-type gallium nitride compound semiconductor layer is formed as the topmost surface layer while the temperature of the substrate crystal is at 700° C. or higher, and the substrate crystal is then cooled.

The present invention also provides a method of growing a low-resistance p-type gallium nitride-based compound semiconductor as described above, characterized in that after a requisite multilayer film which contains a p-type gallium nitride-based compound semiconductor layer has been formed, an n-type group III/V-compound semiconductor layer which contains only As or only P or both As and P as group V elements is formed while the temperature of the substrate crystal is at 700° C. or higher, and the substrate crystal is then cooled.

The present invention also provides a method of growing a low-resistance p-type gallium nitride-based compound semiconductor as described above, characterized in that when a gallium nitride-based compound semiconductor diode having a p-n junction is formed, only an n-type gallium nitride-based compound semiconductor is formed after a last p-type gallium nitride-based compound semiconductor is grown, and the temperature of the substrate crystal is 700° C. or higher when the growth is completed.

The present invention described above is based on an experimental finding that less hydrogen passivation tends to be caused at a crystal temperature of 700° C. or higher during growth by vapor phase epitaxy. In addition, a p-type gallium nitride-based compound semiconductor that has undergone hydrogen passivation releases hydrogen at a temperature of 400° C. to 700° C. or higher. This is evidenced by the fact that the resistance of the p-type layer can be decreased by thermal annealing at 400°–700° C. Accordingly, the p-type gallium nitride which is grown at a substrate temperature of 700° C. or higher undergoes hydrogen passivation mainly when it is being cooled after completion of the growth. Here, since the p-type dopant is charged negatively within the semiconductor crystal, hydrogen which diffuses from the crystal surface and combines with the p-type dopant is charged positively. Therefore, the diffusion of the positively charged hydrogen is delayed in an n-type semiconductor layer free of negatively charged acceptors.

The method of growing a low-resistance p-type gallium nitride-based compound semiconductor according to the present invention is designed so that after completion of the crystal growth of the p-type gallium nitride-based compound semiconductor, the ambient atmosphere is replaced, at a temperature of 700° C. or higher, by a hydrogen-free inert gas such as nitrogen, helium or argon, and then the crystal is cooled. Capture of hydrogen by the crystal during the cooling of the crystal is prevented in way, hereby preventing hydrogen passivation.

The method of growing a low-resistance p-type gallium nitride-based compound semiconductor according to the present invention is also designed so as to include, in addition to the requirements of the method described above, addition of a gas of an organic nitrogen compound having less than three direct bonds of nitrogen and hydrogen to the ambient gas during the process of cooling the crystal. Since such an organic nitrogen compound gas has a smaller content of hydrogen sources than ammonia gas, and can also supply reactive nitrogen, it causes less hydrogen passivation so that thermal deterioration of the crystal during the cooling process is prevented.

The method of growing a lot-resistance p-type gallium nitride-based compound semiconductor according to the present invention is also designed so that an n-type gallium nitride-based compound semiconductor layer is former at a substrate temperature of 700° C. or higher, as a topmost surface layer after the last p-type layer is grown, and the crystal is then cooled. The diffusion of hydrogen from the crystal surface toward the substrate is suppressed based on the phenomenon that diffusion of positively charged hydrogen is slow in n-type layers. The n-type surface layer may be etched off after the crystal is cooled off to an appropriate temperature. To facilitate removal of the n-type surface layer by selective etching, the n-type surface layer may preferably contain arsenic or phosphorus as its constituent group V element.

The method of growing a low-resistance p-type gallium nitride-based compound semiconductor according to the present invention is also designed so that when a crystal structure containing a p-n junction diode is to be formed, only n-type gallium nitride-based compound semiconductor layers are formed at a growth temperature of 700° C. or higher after the p-type gallium nitride-based compound semiconductor is grown, and the crystal is then cooled. Diffusion of the hydrogen toward the p-type layer is prevented based on the phenomenon in which diffusion of hydrogen is delayed in n-type layers. In this case, etching of the surface layer after the crystal has been cooled becomes unnecessary.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

First through fifth embodiments of the present invention which relates to a method of growing a low-resistance p-type gallium nitride-group compound semiconductor by vapor phase epitaxy, which will now be described, involve the step of forming a p-type gallium nitride-based compound semiconductor on a substrate crystal heated while mixing a starting gas of a compound of an element of group III, a starting gas of a nitrogen compound rand a gas of a p-type dopant into a carrier gas such as hydrogen or nitrogen for dilution.

In the method of growing a low-resistance p-type gallium nitride-based compound semiconductor according to a first embodiment of the present invention, the temperature of the substrate crystal immediately after completion of the crystal growth is 700° C. or higher, and the cooling of the substrate crystal at 700° C. or less after completion of the crystal growth is carried out in an atmosphere of a hydrogen-free carrier gas. The carrier gas available for use includes a hydrogen-free inert gas such as helium, nitrogen or argon.

Figure 1:
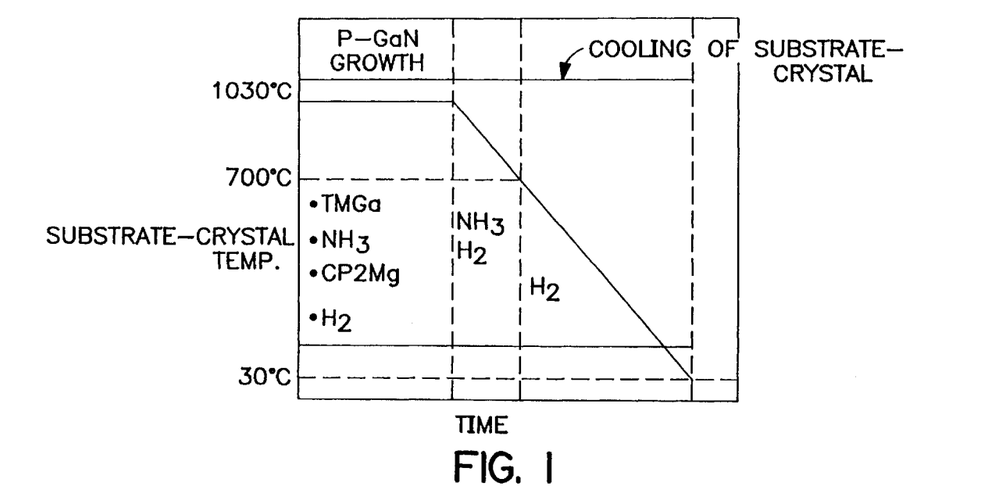
FIG. 1 is a schematic diagram illustrative of a variation of substrate temperature during the process of vapor phase epitaxy according to a first embodiment of the preset invention, and types of the gases introduced into the crystal grow chamber.

FIG. 1 is a schematic diagram illustrative of the temperature profile of a substrate crystal during the process of crystal growth by vapor phase epitaxy by the method of growing a low-resistance p-type gallium nitride-based compound semiconductor according to the first embodiment of the present invention, and types of the gases in a crystal deposition chamber. In FIG. 1 the temperature of the substrate crystal during the process of growth of a crystal containing p-type gallium nitride is 1,030° C., The cooling of the substrate crystal after completion of the crystal growth is performed in a gaseous atmosphere of hydrogen as the carrier gas and ammonia when the temperature is 700° C. or higher, and the ambient gas is replaced by nitrogen gas alone at 700° C. The crystal surface undergoes thermal deterioration while cooling at 700° C. or lower. After the crystal has been cooled, the gallium nitride-based compound semiconductor on the thermally deteriorated crystal surface layer is etched off.

Since the temperature during the crystal growth and during cooling of the substrate crystal in the atmosphere of ammonia after completion of the crystal growth is over the annealing temperature (400°–700° C.) in a related art described in Japanese Unexamined Patent Application Disclosure HEI 5-183189 no hydrogen passivation is caused up to this point of time. Since the ambient gas consists only of nitrogen while the substrate crystal is cooled at 700° C. or lower, no hydrogen is diffused through the crystal surface. The crystal surface layer, however, undergoes thermal deterioration during the process of cooling. A crystal which has a desired layer structure and a low-resistance p-type layer is obtained by etching off the gallium nitride-based compound semiconductor on the thermally deteriorated crystal surface layer after the crystal has been cooled.

In the method of growing a low-resistance p-type gallium nitride-based compound semiconductor by vapor phase epitaxy according to a second embodiment of the present invention, different from the first embodiment, the cooling of the substrate crystal at 700° C. or lower after completion of the crystal growth is carried out in an atmosphere of a mixed gas of hydrogen-free carrier gas and a gas of an organic nitrogen compound which has less than three direct bonds of nitrogen and hydrogen. The organic nitrogen source used includes, for example, tert-butylamine, ethyl azide and dimethylhydrazine.

Figure 2:
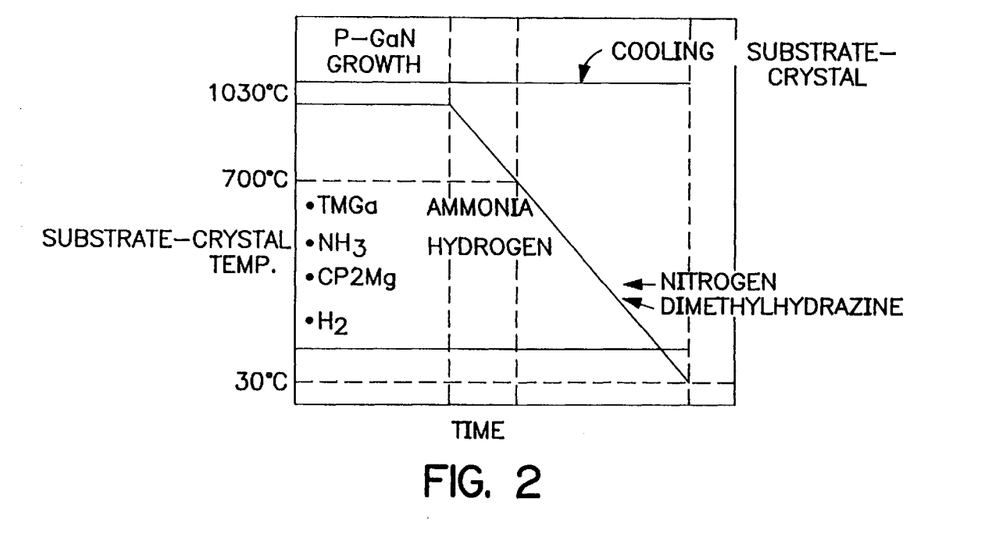
FIG. 2 is a schematic diagram illustrative of a variation of substrate temperature during the process of vapor phase epitaxy according to a second embodiment of the preset invention, and types of the gases introduced into the crystal growth chamber

FIG. 2 is a schematic diagram illustrative of the temperature profile of a substrate crystal during the process of crystal growth by vapor phase epitaxy by the method of growing a low-resistance p-type gallium nitride-based compound semiconductor according to the second embodiment of the present invention, and types of the gases in a crystal deposition chamber. In FIG. 2, the temperature of the substrate crystal during the process of growth of a crystal containing p-type gallium nitride is 1,030° C. The cooling of the substrate crystal after completion of the crystal growth, is performed in a gaseous atmosphere of hydrogen as the carrier gas and ammonia when the temperature is 700° C. or higher, and the ambient gas is replaced, at 700° C., by a mixed gas of nitrogen gas and dimethylhydrazine, and the substrate crystal is cooled to room temperature.

In the method of growing a low-resistance p-type gallium nitride-based compound semiconductor by vapor phase epitaxy according to the second embodiment of the present invention, since the temperature during the crystal growth and during cooling of the substrate crystal in the atmosphere of ammonia after completion of the crystal growth is over the annealing temperature (400 –700° C.) provided in the related art described in Japanese Unexamined Patent Application Disclosure HEI 5-183189, no hydrogen passivation is caused up to this point of time. Since the ambient gas consists only of nitrogen and dimethyl- hydrazine while the substrate crystal is cooled at 700° C. or lower, less hydrogen passivation is caused as compared with the case where the cooling is performed in an atmosphere of nitrogen. This is because the number of hydrogen-nitrogen direct bonds of dimethylhydrazine is two, smaller than three, the number for ammonia.

In addition, unlike the first embodiment, since the crystal is cooled in an atmosphere including reactive nitrogen which results from thermal decomposition of dimethyl-hydrazine, the thermal deterioration of the crystal surface is prevented. According to the second embodiment, the productivity is high regardless of the layer structure which is desired for the crystal. For reference only, although the crystal obtained by growth of a gallium nitride compound semiconductor by vapor phase epitaxy using an organic nitrogen source is not so excellent as compared with the crystal which is obtained when ammonia is used, no problem arises so far as an organic nitrogen source is used only for protection of the surface.

According to a third embodiment of the present invention, after a requisite multilayer film containing a p-type gallium nitride-based compound semiconductor layer has been formed, an n-type gallium nitride-based compound semiconductor layer is formed as the topmost surface layer while the substrate crystal is at a temperature of 700° C. or higher, and the substrate crystal is then cooled.

Figure 3:
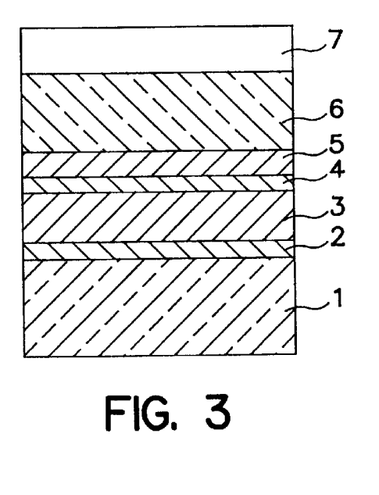
FIG. 3 is a schematic view illustrative of a layer structure of a LED crystal which is prepared by vapor phase epitaxy according to a third embodiment of the preset invention.

FIG. 3 illustrates the layer structure of an LED crystal which is prepared according to the third embodiment of the present invention. In FIG. 3, the LED crystal consists of a GaN buffer layer 2, an Si-doped GaN layer 3, an InGaN active layer 4, a Mg-doped p-type AlGaN layer 5, a Mg-doped p-type GaN layer 6 and a Si-doped n-type GaN crystal surface layer 7 on a sapphire substrate 1. The temperature of the substrate crystal during growth of the Mg-doped p-type AlGaN layer 5, the Mg-doped p-type GaN layer 6 and the Si-doped n-type GaN crystal surface layer 7 is 1,030° C. The cooling after completion of the crystal growth is performed by a conventional cooling process. In the growth method according to the third embodiment, the cooling process described regarding the first and the second embodiments may be used. After the crystal has been cooled to room temperature, the crystal surface layer 7 is etched off.

Since the temperature at the time when the crystal growth of the surface layer 7 of the Si-doped n-type GaN crystal is completed is over the annealing temperature (400°–700° C.) in the related art described in Japanese Unexamined Patent Application Disclosure HEI 5-183189, no hydrogen passivation is caused up to this point of time. Although hydrogen is diffused through the crystal surface while cooling after completion of the crystal growth, the hydrogen which becomes combined with the negatively charged acceptor (Mg) is positively charged. Accordingly, since the diffusion of the positively charged hydrogen is delayed in the Si-doped n-type semiconductor layer 7 free of negatively charged acceptors, the positively charged hydrogen accumulates on the uppermost surface of the crystal, the Si-doped n-type GaN layer 7, and thus there is no possibility that the Mg-doped p-type AlGaN layer 5 and the Mg-doped p-type GaN layer 6 undergo hydrogen passivation. A crystal which has a desired layer structure and a low-resistance p-type layer is obtained by etching off the crystal surface layer after the crystal has been cooled to room temperature.

According to a fourth embodiment of the present invention, after a requisite multilayer film containing a p-type gallium nitride-based compound semiconductor layer has been formed, an n-type group III/V-compound semiconductor layer which contains only As or only P or both As and P as elements of group V is formed while the substrate crystal is at a temperature of 700° C. or higher, and the substrate crystal is then cooled.

Figure 4:
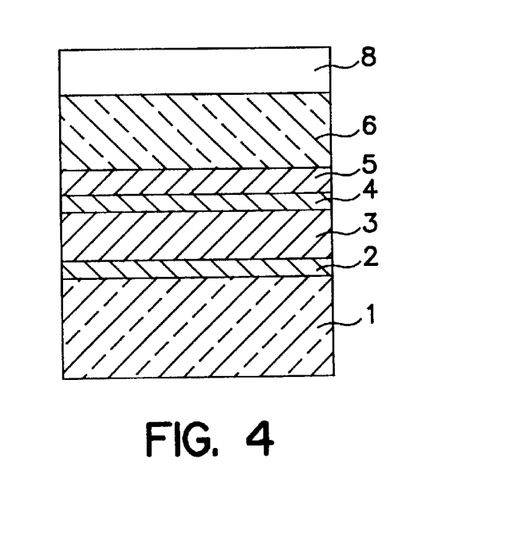
FIG. 4 is a schematic view illustrative of a layer structure of a LED crystal which is prepared by vapor phase epitaxy according to a fourth embodiment of the preset invention.

FIG. 4 illustrates the layer structure of an LED crystal which is prepared according to the fourth embodiment. In FIG. 4, the LED crystal consists of a GaN buffer layer 2, an Si-doped GaN layer 3, an InGaN active layer 4, a Mg-doped p-type AlGaN layer 5, a Mg-doped p-type GaN layer 6 and a Si-doped n-type GaAs crystal surface layer 8 on a sapphire substrate 1. The temperature of the substrate crystal during crystal growth in the Mg-doped p-type AlGaN layer 5 and the Mg-doped p-type GaN layer 6 is 1,030° C. After crystal growth of the Mg-doped p-type AlGaN layer 5 and the Mg-doped p-type GaN layer 6, the temperature of the substrate crystal is lowered to 800° C. to form the Si-doped n-type GaAs crystal surface layer 8. The cooling after completion of the crystal growth is performed by a conventional cooling process. Alternatively, the cooling process described regarding the first and the second embodiments of the present invention may be used. After the crystal has been cooled to room temperature, the crystal surface layer of the Mg-doped p-type AlGaN layer 5 and the Mg-doped p-type GaN layer 6 is etched off.

According to the fourth embodiment, the topmost n-type GaN surface layer according to the third embodiment is replaced by the Si-doped n-type GaAs layer 8. Since GaAs has a lattice constant which is approximately 15% higher than that of gallium nitride-based compound semiconductor, the crystal surface layer or the Si-doped n-type GaAs layer 8 grown is polycrystalline or amorphous. According to the present invention, since the temperature when the growth of the crystal which includes the crystal surface layer has been completed is over the conventional annealing temperature (400°–700° C.) in the related art described in Japanese Unexamined Patent Application Disclosure HEI 5-183189, no hydrogen passivation is caused until the crystal surface layer is formed. During the process of cooling after completion of the crystal growth, hydrogen passivation of the Mg-doped p-type AlGaN layer 5 and the Mg-doped p-type GaN layer 6 is prevented by the same principle as according to the third embodiment. A crystal which has a desired layer structure and a low-resistance p-type layer is obtained by etching off the Si-doped n-type GaAs layer 8 or the crystal surface layer after the crystal has been cooled to room temperature or other desired temperatures. The process does not depend on the layer structure which is desired for the crystal. In addition, although the gallium nitride-based compound semiconductor is not easily wet etches, the Si-doped n-type GaAs layer 8 or the crystal surface layer is easily removed selectively, since GaAs is easily etched with an aqueous solution of sulfuric acid and hydrogen peroxide mixture. Here, although the crystal surface layer according to the fourth embodiment is GaAs the crystal surface layer may be composed of any of compound semiconductors which include As or P as an element of group V, such as InP, GaP, InGaAs or InGaAsP.

According to a fifth embodiment of the present invention, when a gallium nitride-based compound semiconductor diode having a p-n junction is being formed, only an p-type gallium nitride-based compound semiconductor is formed after a last p-type gallium nitride-based compound semiconductor is grown, and the temperature of the substrate crystal is designed to be 700° C. or higher when the growth is completed.

Figure 5:
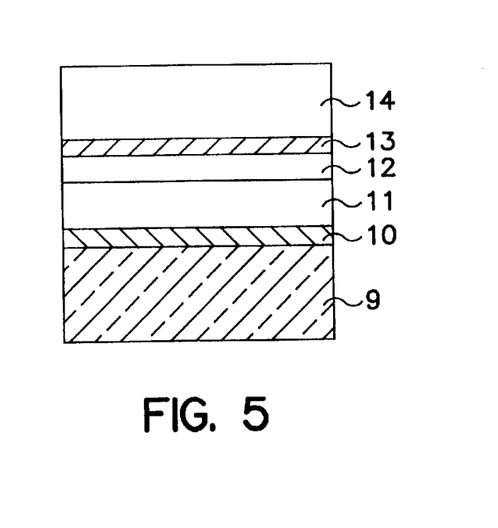
FIG. 5 is a schematic view illustrative of a layer structure of a LED crystal which is prepared by vapor phase epitaxy according to a fifth embodiment of the preset invention.

FIG. 5 illustrates the layer structure of an LED crystal which is prepared according to the fifth embodiment of the present invention. In FIG. 5, the LED crystal consists of a GaN buffer layer 11, a Mg-doped p-type GaN layer 11, a Mg-doped p-type AlGaN layer 12, an InGaN active layer 13 and a Si-dope n-type GaN layer 14 on a sapphire substrate 9. The temperature of the substrate crystal during crystal growth of the Mg-doped p-type GaN layer 11, the Mg-doped p-type AlGaN layer 12 and the Si-doped n-type GaN layer 14 is 1,030° C. First, the Mg-doped p-type GaN layer 11 and the Mg-doped p-type AlGaN layer 12 which are p-type gallium nitride compound semiconductors are formed, and finally the Si-doped n-type GaN layer 14 is formed; the Si-doped n-type GaN layer 14 is the topmost surface layer of the crystal. The cooling after completion of the crystal growth is performed by a conventional cooling process. Alteratively, the cooling process described regarding the first and the second embodiments may be used. According to the above-mentioned method of growing a low-resistance p-type gallium nitride-based compound semiconductor by vapor phase epitaxy, since the temperature at the time when the crystal growth is completed is over the annealing temperature (400°–700° C.) in the related art described in Japanese Unexamined Patent Application Disclosure HEI 5-183189, no hydrogen passivation is caused up to this point of time. Here, the crystal surface is the Si-doped n-type GaN layer 14. Although hydrogen is diffused through the crystal surface while cooling after completion of the crystal growth, the hydrogen which becomes combined with the negatively charged; acceptor (Mg) is positively charged. Accordingly, since the diffusion of the positively charged hydrogen is delayed in the n-type semiconductor layer free of negatively charged acceptors, the positively charged hydrogen accumulates on the uppermost surface of the crystal, the Si-doped n-type GaN layer 14, and thus there is no possibility that the Mg-doped p-type GaN layer 11 and the Mg-doped p-type AlGaN layer 12 undergo hydrogen passivation. Here, it is unnecessary to remove the crystal surface layer by etching after the crystal has been cooled to room temperature. In this way, a crystal is obtained which has a desired layer structure and a low-resistance p-type layer. The method of growing a low-resistance p-type gallium nitride-based compound semiconductor by vapor phase epitaxy does not depend on the layer structure which is designed for the crystal.

By the method of growing a low-resistance p-type gallium nitride-based compound semiconductor according to the first embodiment, a crystal which has a desired layer structure and a low-resistance p-type layer is obtained by etching off the thermally deteriorated crystal surface layer of the gallium nitride-based compound semiconductor layer after cooling, and this method, which does not depend on the layer structure which is desired for the crystal, has excellent productivity.

By the method of growing a low-resistance p-type gallium nitride-based compound semiconductor according to the second embodiment, since the crystal is cooled in an atmosphere of active nitrogen which results from thermal decomposition of dimethylhydrazine or the like, the thermal deterioration of the crystal surface is prevented, and the method, which does not depend on the layer structure which is desired for the crystal, has excellent productivity.

By the method of growing a low-resistance p-type gallium nitride-based compound semiconductor according to the third embodiment, since the diffusion of the positively charged hydrogen is delayed in the n-type semiconductor layer 7 free of negatively charged acceptors, the positively charged hydrogen accumulates on the uppermost surface of the crystal, the n-type GaN layer, and thus there is no possibility that the p-type layer undergoes hydrogen passivation, and a crystal which has a desired layer structure and a low-resistance p-type layer is obtained by etching off the crystal surface layer after the crystal has been cooled to room temperature. This method, which does not depend on the layer structure which is desired for the crystal, has excellent productivity.

The method of growing a low-resistance p-type gallium nitride-based compound semiconductor according to the fourth embodiment prevents hydrogen passivation of the p-type gallium nitride-based compound semiconductor layer during the process of cooling the crystal after completion of the crystal growth, and provides a crystal which has a desired layer structure and a low-resistance p-type layer, by etching off the crystal surface layer or the GaAs layer after the crystal has been cooled to room temperature, without depending on the layer structure which is desired for the crystal. In addition, since GaAs is easily etched with sulfuric acid/an aqueous solution of hydrogen peroxide, the crystal surface layer or the GaAs layer is easily removed selectively.

By the method of growing a low-resistance p-type gallium nitride-based compound semiconductor according to the fifth embodiment, since the diffusion of the positively charged hydrogen is delayed in the n-type semiconductor layer 7 free of negatively charged acceptors, the positively charged hydrogen accumulates on the uppermost surface of the crystal, the n-type GaN layer, and thus there is no possibility that the p-type layer undergoes hydrogen passivation, and a crystal which has a desired layer structure and a low-resistance p-type layer is obtained without etching off the crystal surface layer after the crystal has been cooled to room temperature. Therefore, the method, which does not depend on the layer structure which is desired for the crystal and does not need etching of the surface layer, has excellent productivity.

While the present invention has been described in connection with certain preferred embodiments, it is to be understood that the subject matter encompassed by way of the present invention in not to be limited to those specific embodiments. On the contrary, it is intended for the subject matter of the invention to include all alternatives, modifications and equivalents as can be included within the spirit and scope of the following claims.

What is claimed is:

1. A method of growing a low-resistance p-type gallium nitride-based compound semiconductor by vapor phase epitaxy, said method comprising a step of introducing on a heated crystal substrate, a gas mixture of a group III element compound source gas, a nitrogen compound source gas, and a p-type dopant gas all diluted in a carrier gas to form a p-type gallium nitride-based compound semiconductor, wherein the temperature of the substrate crystal immediately after completion of the crystal growth is 700° C. or higher, and only after completion of the crystal growth, the substrate crystal is then cooled to temperatures of 700° C. or lower in a hydrogen-free gas atmosphere.

2. A method of growing a low-resistance p-type gallium nitride-based compound semiconductor by vapor phase epitaxy, as claimed in claim 1, wherein at least one inert gas selected from a group consisting of helium, nitrogen and argon is used as the carrier gas.

3. A method according to claim 1, wherein said carrier gas comprises hydrogen or nitrogen gas.

4. A method of growing a low-resistance p-type gallium nitride-based compound semiconductor by vapor phase epitaxy which comprises the step of forming a p-type gallium nitride-based compound semiconductor on a substrate crystal heated while mixing a source gas of a compound of an element of group III, a source gas of a nitrogen compound and a gas of a p-type dopant into a carrier gas for dilution,
characterized in that after a requisite multilayer film which contains a p-type gallium nitride-based compound semiconductor layer has been formed, an n-type gallium nitride compound semiconductor layer is formed as the crystal surface layer while the temperature of said substrate crystal is at 700° C. or higher, and said substrate crystal is then cooled to temperatures of 700° C. or lower.

5. A method according to claim 4, wherein said carrier gas comprises hydrogen or nitrogen gas.

6. A method of growing a low-resistance p-type gallium nitride-based compound semiconductor by vapor phase epitaxy which comprises the step of forming a p-type gallium nitride-based compound semiconductor on a substrate crystal heated while mixing a source gas of a compound of an element of group III, a source gas of a nitrogen compound and a gas of a p-type dopant into a carrier gas for dilution,
characterized in that after a requisite multilayer film which contains a p-type gallium nitride-based compound semiconductor layer has been formed, an n-type group III/V-compound semiconductor layer which contains only As or only P or both As and P as elements of group V is formed while the temperature of said substrate crystal is at 700° C. or higher, and said substrate crystal is then cooled to temperatures of 700° C. or lower.

7. A method according to claim 6, wherein said carrier gas comprises hydrogen or nitrogen gas.

8. A method of growing a low-resistance p-type gallium nitride-based compound semiconductor by vapor phase epitaxy which comprises the step of forming a p-type gallium nitride-based compound semiconductor on a substrate crystal heated while mixing a source gas of a compound of an element of group III, a source gas of a nitrogen compound and a gas of a p-type dopant into a carrier gas for dilution,
characterized in that when a gallium nitride-based compound semiconductor diode having a p-n junction is formed, only an n-type gallium nitride-based compound semiconductor is formed after a p-type gallium nitride-based compound semiconductor has grown, and the temperature of said substrate crystal is 700° C. or higher when the growth is completed.

9. A method according to claim 8, wherein said carrier gas comprises hydrogen or nitrogen gas.

10. A method of growing a low-resistance p-type gallium nitride-based compound semiconductor by vapor phase epitaxy, said method comprising a step of introducing on a heated crystal substrate, a gas mixture of a group III element compound source gas, a nitrogen compound source gas, and a p-type dopant gas all diluted in a carrier gas to form a p-type gallium nitride-based compound semiconductor, wherein the temperature of the substrate crystal immediately after completion of the crystal growth is 700° C. or higher, and after completion of the crystal growth, cooling the substrate crystal to temperatures 700° C. or lower is performed in a hydrogen-free gas atmosphere after completion of the crystal growth is carried out in an atmosphere of a mixed gas of a hydrogen-free carrier gas and a gas of an organic nitrogen compound which has less than three direct bonds of nitrogen and hydrogen.

11. A method according to claim 10, wherein said carrier gas comprises hydrogen or nitrogen gas.

12. A method of growing a low-resistance p-type gallium nitride-based compound semiconductor by vapor phase epitaxy, said method comprising a step of introducing on a heated crystal substrate, a gas mixture of a group III element compound source gas, a nitrogen compound source gas, and a p-type dopant gas all diluted in a carrier gas to form a p-type gallium nitride-based compound semiconductor, wherein the temperature of the substrate crystal immediately after completion of the crystal growth is 700° C. or higher, and after completion of the crystal growth, cooling the substrate crystal to temperatures 700° C. or lower is performed in a hydrogen-free gas atmosphere after completion of the crystal growth is carried out in an atmosphere of a mixed gas of a hydrogen-free carrier gas and a gas of an organic nitrogen compound which has less than three direct bonds of nitrogen and hydrogen, and at least one organic nitrogen selected from a group consisting of tert-butylamine, ethyl azide and dimethylhydrazine is used as the source of said organic nitrogen compound.

13. A method according to claim 12, wherein said carrier gas comprises hydrogen or nitrogen gas.

* * * * *